United States Patent
Zhang et al.

(10) Patent No.: US 12,339,745 B1
(45) Date of Patent: Jun. 24, 2025

(54) SOLID-STATE DRIVE WITH MULTIMODE COMPRESSION AND ERROR CORRECTION

(71) Applicant: ScaleFlux, Inc., San Jose, CA (US)

(72) Inventors: Tong Zhang, Albany, NY (US); Mark Vernon, San Jose, CA (US); Jiangpeng Li, San Jose, CA (US); Yang Liu, Milpitas, CA (US); Fei Sun, Irvine, CA (US)

(73) Assignee: SCALEFLUX, INC., San Jose, CA (US)

( * ) Notice: Subject to any disclaimer, the term of this patent is extended or adjusted under 35 U.S.C. 154(b) by 0 days.

(21) Appl. No.: 18/641,942

(22) Filed: Apr. 22, 2024

(51) Int. Cl.
| | |
|---|---|
| *G06F 11/10* | (2006.01) |
| *G06F 11/00* | (2006.01) |
| *G06F 11/07* | (2006.01) |
| *G06F 12/02* | (2006.01) |
| *H03M 13/00* | (2006.01) |
| *H04L 1/00* | (2006.01) |

(52) U.S. Cl.
CPC .......... *G06F 11/1068* (2013.01); *G06F 11/00* (2013.01); *G06F 11/0703* (2013.01); *G06F 11/0727* (2013.01); *G06F 12/0246* (2013.01); *H03M 13/618* (2013.01); *H03M 13/6362* (2013.01); *H04L 1/0008* (2013.01); *H04L 1/0068* (2013.01); *H04L 1/0069* (2013.01); *H04L 2209/20* (2013.01)

(58) Field of Classification Search
CPC .. G06F 11/1068; G06F 12/0246; G06F 11/00; G06F 11/0703; G06F 11/0727; H03M 13/6362; H03M 13/618; H04L 1/0008; H04L 2209/20; H04L 1/0068; H04L 1/0069

USPC ....... 714/764, 768, 769, 773, 774, 790, 799, 714/800, 701

See application file for complete search history.

(56) References Cited

U.S. PATENT DOCUMENTS

| | | | | |
|---|---|---|---|---|
| 9,231,734 | B2* | 1/2016 | Jeong | H03M 13/6362 |
| 9,946,490 | B2* | 4/2018 | Hall | G06F 12/1009 |
| 2005/0149821 | A1* | 7/2005 | Lee | H04L 1/0041 |
| | | | | 714/758 |
| 2007/0101229 | A1* | 5/2007 | Niu | H03M 13/6356 |
| | | | | 714/752 |
| 2011/0099321 | A1* | 4/2011 | Haines | G06F 12/0246 |
| | | | | 711/E12.001 |
| 2014/0258815 | A1* | 9/2014 | Jeong | H04L 1/0063 |
| | | | | 714/790 |

(Continued)

OTHER PUBLICATIONS

Pereira, The Effects of Zero Padding on the CDPD Wide-Area IVHS Data Load, 1995, IEEE, pp. 863-869 (Year: 1995).*

*Primary Examiner* — John J Tabone, Jr.
(74) *Attorney, Agent, or Firm* — Hoffman Warnick LLC

(57) ABSTRACT

A system and method for providing compression and error correction coding (ECC) in a solid-state drive (SSD). A method is provided that includes: determining whether a data item is to be written to flash memory using a general-purpose mode or a zero-padding mode: in response to a determination that a data item is to be written into flash memory using the zero-padding mode: padding the data item with an all-zero tail to form an LBA data block of a predefined size; performing ECC coding on the LBA block to generate an ECC codeword; removing the all-zero tail from the ECC codeword to generate a shortened ECC codeword; and storing the shortened ECC codeword in flash memory.

12 Claims, 9 Drawing Sheets

(56) References Cited

U.S. PATENT DOCUMENTS

2017/0262212 A1* 9/2017 Nakanishi ............. G06F 3/0688
2018/0032278 A1* 2/2018 Hall ...................... G06F 3/0608

* cited by examiner

SOLID-STATE DRIVE WITH MULTIMODE COMPRESSION AND ERROR CORRECTION

TECHNICAL FIELD

The present invention relates to the field of solid-state drives (SSD), and particularly to SSDs that more effectively serve applications that demand different I/O block sizes.

BACKGROUND

Solid-state drives (SSDs), which use non-volatile NAND flash memory technology, are being pervasively deployed in numerous computing and storage systems. In addition to one or multiple NAND flash memory chips, each SSD must contain a controller chip that manages all the NAND flash memory chips. Within each NAND flash memory chip, all the memory cells are organized in an "array→block→page" hierarchy, where one NAND flash memory array consists of a large number (e.g., thousands) of blocks, and each block contains a certain number of pages (e.g., 256). The size of each flash memory page typically ranges from 8KiB to 32KiB, and the size of each flash memory block is typically tens of megabytes (MBs). Data are programmed in the unit of flash memory pages. NAND flash memory cells must be erased before being re-programmed, and the erase operation is carried out in the unit of blocks (i.e., all the pages within the same block must be erased at the same time). As a result, SSDs do not support in-place data update and hence must perform out-of-place data update, i.e., when the host updates/writes data, SSDs cannot directly over-write old data with the new data at the same NAND flash memory physical page location, instead SSDs must write the new data to another NAND flash memory physical page and mark the old data as invalid. The continuous scaling of NAND flash memory technology comes with a continuous degradation of raw storage reliability. As a result, SSDs must employ sufficiently strong ECC (error correction code) to ensure the data integrity.

To support out-of-place data update on NAND flash memory, SSDs must internally implement an indirect data address mapping: SSDs internally manage data on NAND flash memory pages in the unit of physical data blocks. Each physical data block is assigned with one unique physical block address (PBA). Instead of directly exposing PBAs to the host, SSDs expose an array of logical block address (LBA) and internally manage/maintain the mapping between LBA and PBA. The software component responsible for managing the LBA-PBA mapping is called the flash translation layer (FTL). Since NAND flash memory does not support in-place data update, writes to one LBA will trigger a change of the LBA-PBA mapping (i.e., the same LBA is mapped with another PBA to which the new data are physically written).

To exploit runtime data compressibility, SSDs could integrate the transparent compression capability: Each LBA data block is compressed individually to reduce the data footprint and meanwhile avoid degrading SSD IOPS (I/O per second) performance. Inside SSDs, all the variable-length compressed LBA data blocks are packed and stored on NAND flash memory chips. For each compressed LBA data block, the FTL needs to keep track of its length and physical location. To serve LBA read requests, SSDs internally fetch the compressed data block from NAND flash memory, decompress the data block to reconstruct the original LBA data block, and send it back to host. In conventional practice, SSDs use general-purpose compression algorithms (e.g., zlib, ZSTD, or LZ4) that do not assume any specific data content characteristics. Although they can serve a wide range of applications, those general-purpose compression algorithms tend to consume a significant amount of energy consumption.

Recent years witnessed the significant growth of high-value AI-oriented applications that involve a huge amount of active working data set (e.g., hundreds of GB and multiple TBs) and meanwhile are dominated by moderate-size data access (e.g., 256 B or 400 B per data access). For such applications, hybrid-DRAM/SSD memory hierarchy can be much more cost-effective than DRAM-only memory. For such applications, their data are mainly numeric (e.g., floating-point and fix-point numbers) that tend to have very low compressibility.

SUMMARY

Aspects of this disclosure provide a system and method for implementing multimode SDDs that better support compression while optimally serving different categories of applications.

A first aspect of the disclosure provides a multimode solid-state drive (SSD), comprising: a plurality of flash memory chips addressable via physical block addresses (PBAs); and a controller chip that utilizes a mapping table to map logical block addresses (LBAs) to PBAs, wherein the controller chip includes a general-purpose mode and a zero-padding mode for providing compression and error correction coding (ECC) and implements a process that includes: in response to a determination that a data item is to be written into flash memory using the zero-padding mode: padding the data item with an all-zero tail to form an LBA data block of a predefined size; performing ECC coding on the LBA block to generate an ECC codeword; removing the all-zero tail from the ECC codeword to generate a shortened ECC codeword; and storing the shortened ECC codeword in flash memory.

A second aspect of the disclosure provides a method for providing compression and error correction coding (ECC) in a solid-state drive (SSD), comprising: determining whether a data item is to be written to flash memory using a general-purpose mode or a zero-padding mode: in response to a determination that a data item is to be written into flash memory using the zero-padding mode: padding the data item with an all-zero tail to form an LBA data block of a predefined size; performing ECC coding on the LBA block to generate an ECC codeword; removing the all-zero tail from the ECC codeword to generate a shortened ECC codeword; and storing the shortened ECC codeword in flash memory.

A third aspect of the disclosure provides a multimode solid-state drive (SSD), comprising: a plurality of flash memory chips addressable via physical block addresses (PBAs); and a controller chip that utilizes a mapping table to map logical block addresses (LBAs) to PBAs, wherein the controller chip implements a process that includes: receiving a data item to be written to flash memory; padding the data item with an all-zero tail to form an LBA data block of a predefined size; performing error correction coding (ECC) on the LBA block to generate an ECC codeword; removing the all-zero tail from the ECC codeword to generate a shortened ECC codeword; and storing the shortened ECC codeword in flash memory.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

The drawings are intended to depict only typical aspects of the disclosure, and therefore should not be considered as limiting the scope of the disclosure.

DETAILED DESCRIPTION OF THE DISCLOSURE

Embodiments of the disclosure provide technical solutions for a solid state drive (SSD) infrastructure that more effectively serves applications that demand different I/O block sizes. Recent years have witnessed the significant growth of high-value artificial intelligence (AI) oriented applications that involve a huge amount of active working data set (e.g., hundreds of GiB and multiple TBs) and are meanwhile dominated by moderate-size data access (e.g., 256 B or 512 B per data access). For such applications, a hybrid-DRAM/SSD memory hierarchy can be much more cost-effective than a DRAM-only memory hierarchy. However, with the limited DRAM capacity for an FTL mapping table, modern SSDs cannot well serve moderate-size data access for those applications. Aspects of this disclosure provide systems and methods for enabling SSDs to more effectively serve moderate-size data access at minimal implementation complexity and cost overhead.

Figure 1:
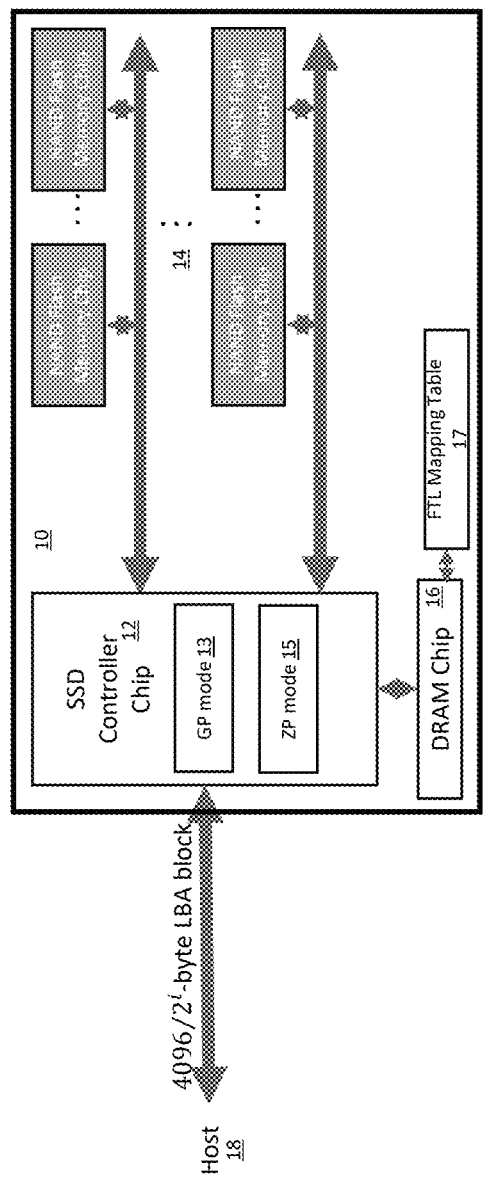
FIG. 1 depicts an SSD memory system, in accordance with an illustrative embodiment.

FIG. 1 illustrates the modern architecture of an SSD 10. An SSD mainly contains a controller chip 12, multiple NAND flash memory chips 14 organized over multiple channels, and one (or a few) DRAM chips 16 that store one or more FTL mapping tables 17. An SSD exposes an array of logical block addresses (LBAs), each LBA associates with $N_i=4096/2^i$ bytes of storage space. For example, when i is 0 or 3, each LBA will associate with $N_0=4096$ bytes or $N_3=512$ bytes. The value of i is determined when SSDs are being formatted by the host 18. As shown and described in further detail herein, controller chip 12 provides two compression/ECC modes, general-purpose (GP) mode 13 and zero-padding (ZP) mode 15.

Recent years witnessed the significant growth of high-value AI-oriented applications that involve a huge amount of active working data set (e.g., hundreds of GBs and multiple TBs) and meanwhile are dominated by moderate-size data access (e.g., 256 B or 400 B per data access). For such applications, storing their huge amount of active working data set over a hybrid-DRAM/SSD memory hierarchy can be much more cost-effective than using DRAM-only memory. SSD I/O interface protocols (e.g., NVMe) allow the host 18 to partition/format SSDs so that different partitions have different LBA block size (e.g., 512 B or 4096 B).

Figure 2:
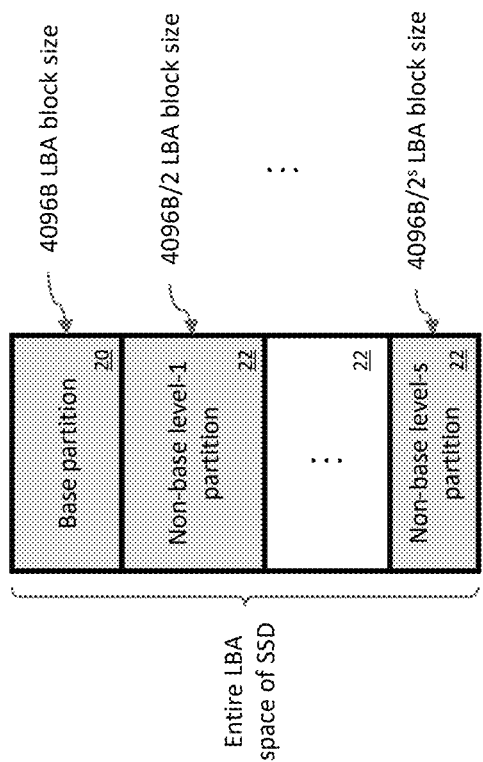
FIG. 2 illustrates the partitioning of a multi-mode SSD's LBA space into multiple partitions with different LBA block size, in accordance with an illustrative embodiment.

Therefore, as illustrated in FIG. 2, to fully utilize the SSD interface I/O bandwidth, host 18 should partition one SSD into multiple partitions, each partition has a distinct LBA block size of $N_i=4096/2^i$ bytes. The base level-0 partition 20 has the LBA block size of 4096 B (i.e., i=0) and provides general-purpose data storage as ordinary SSDs, and for example uses general purpose compression. With less-than-4096 B LBA block size, the other non-base level-i partitions 22 can better serve applications that can benefit from less-than-4096 B I/O block size (e.g., 256 B or 512 B per I/O block data access), and may for example use zero-padding compression.

Figure 3:
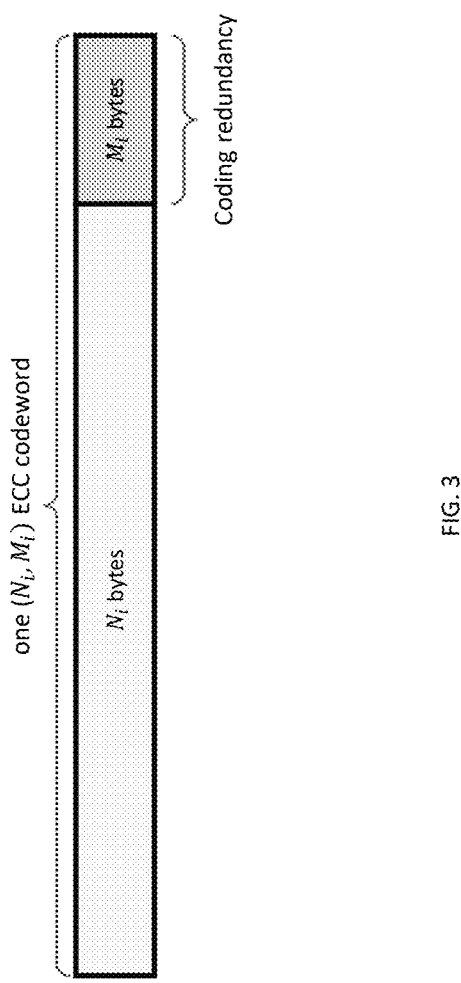
FIG. 3 illustrates an ECC codeword that protects one N_i-byte LBA block with M_i-byte coding redundancy, in accordance with an illustrative embodiment.

As illustrated in FIG. 3, to ensure data integrity in the presence of deteriorating raw reliability of NAND flash memory, SSDs employ strong ECC (error correction code) to protect data. For level-i partition with the LBA block size of $N_i=4096/2^i$ bytes, SSDs should use an $(N_i, M_i)$ ECC that protects each $N_i$-byte LBA block with $M_i$-byte coding redundancy. Upon receiving a read request of one LBA over the level-i partition, the SSD only needs to fetch one $(N_i, M_i)$ ECC codeword to reconstruct the requested $N_i$-byte LBA block, which can ensure the maximum IOPS (I/O per second) performance.

To exploit the runtime data compressibility, SSDs could integrate built-in transparent compression capability. To avoid affecting the IOPS performance, SSDs can compress LBA data blocks individually, i.e., for the level-i partition, compress its each $N_i$-byte LBA data block independently from the other LBA data blocks. To serve a wide range of data content and characteristics, SSDs should implement the block data compression engine using use a general-purpose compression algorithm (e.g., zlib, ZSTD, and LZ4). However, due to their inherently high implementation complexity, the general-purpose compression/decompression hardware engine tends to be very energy consuming.

For applications that are dominated by accessing a large amount of moderate-size data items (e.g., few hundreds of bytes per data item), they could benefit from smaller-than-4 KB LBA block sizes. The size of each data item may vary (e.g., between 200 B and 500 B), while the SSD LBA block size is constant in each SSD partition. Hence, if applications place data items compactly over SSD LBA blocks as in conventional practice, one data item could sit across adjacent LBA blocks, leading to SSD read/write amplification and hence more IOPS performance degradation.

Figure 4:
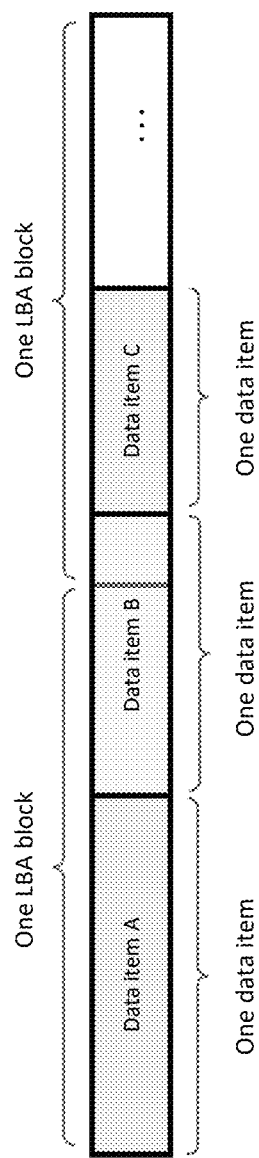
FIG. 4 illustrates the conventional practice that places data items compactly across LBA blocks, in accordance with an illustrative embodiment.

As illustrated in FIG. 4, if the system places multiple data items compactly over the LBA space, one data item may sit across two adjacent LBA blocks (e.g., the data item B as shown in FIG. 4). As a result, to read the data item B from SSD, the system must fetch two LBA blocks from SSD, even though the data item itself is smaller than the LBA block size. Such LBA-unaligned data item placement results in read/write amplification that will degrade the SSD data access efficiency and hence the overall system performance.

Figure 5:
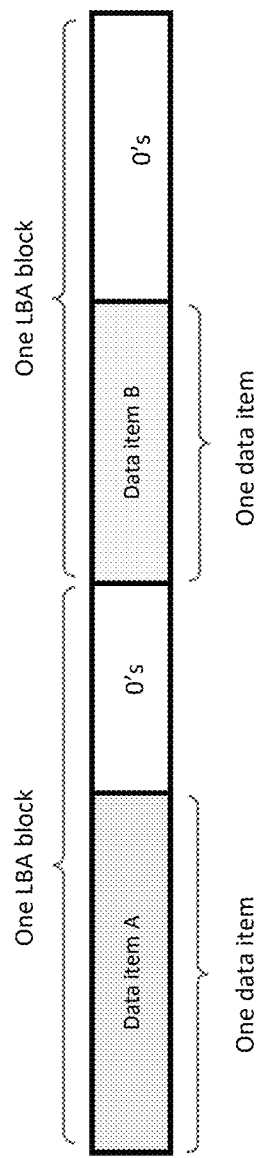
FIG. 5 illustrates a proposed method that places data items in the LBA-aligned manner, in accordance with an illustrative embodiment.

To address this, as shown in FIG. 5, embodiments of the present solution place all the data items in the LBA-aligned manner so that all the smaller-than-LBA-block-size data items reside entirely in one LBA block. This can reduce the data read/write amplification and hence improve the data access speed performance, which meanwhile induces empty space (i.e., space filled with zeros) in LBA blocks (as shown in FIG. 5).

Therefore, all the partitions of an illustrative multi-mode SSD embodiment can fall into two categories: (1) General-purpose partitions: SSDs do not have any prior knowledge/information about the characteristics of the data being written into the partitions; and (2) Zero-padded partitions: LBA blocks in such partitions tend to store data items padded with zeros to ensure that data items are stored in the LBA-aligned manner as discussed above. For these two different categories of partitions, SSDs internally implement compression and ECC using general purpose compression or zero-padded compression as follows.

Figure 6:
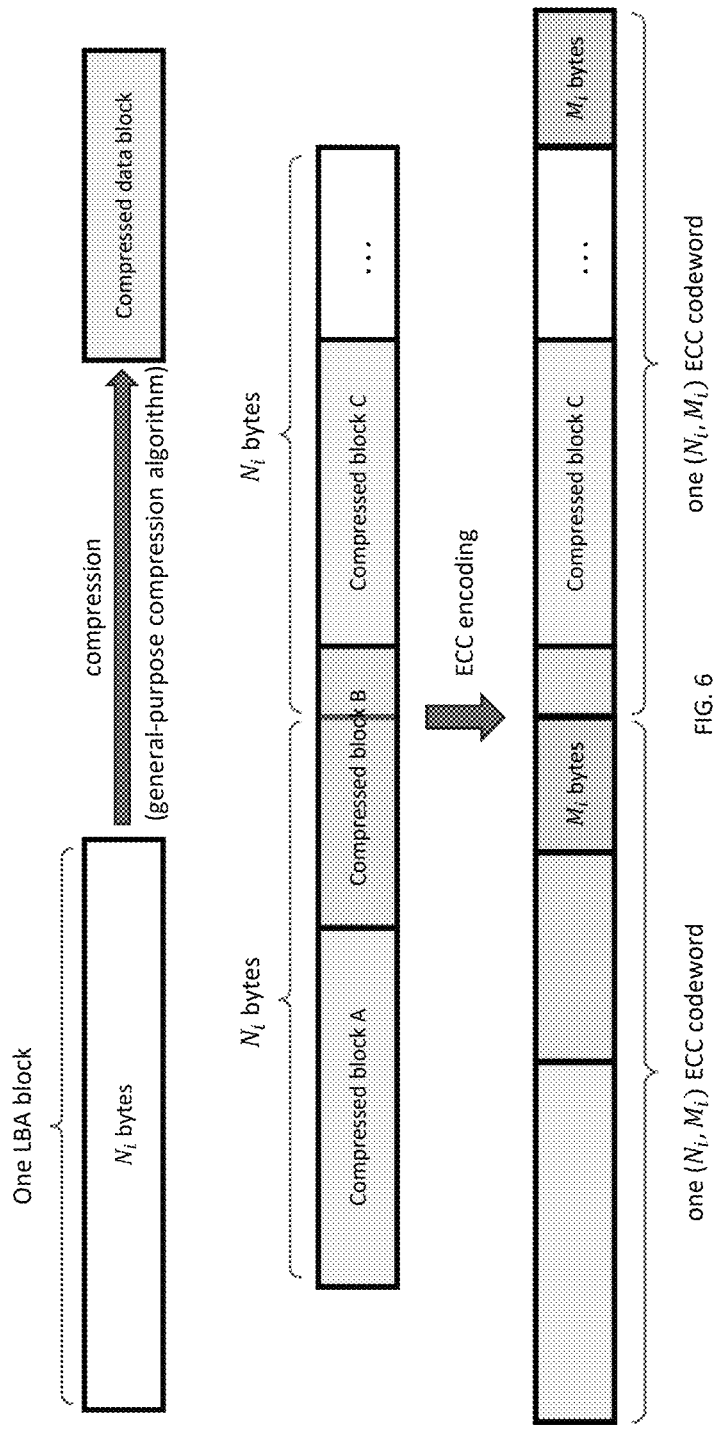
FIG. 6 illustrates the LBA data block compression and ECC encoding in general-purpose partitions, in accordance with an illustrative embodiment.

For a general-purpose level-i partition with the LBA block size of $N_i=4096/2^i$ bytes, as shown in FIG. 6, each $N_i$-byte LBA data block is compressed using a general-purpose block compression algorithm (e.g., zlib, ZSTD, or lz4). Meanwhile, the general-purpose level-i partition uses an ($N_i$, $M_i$) ECC that protects each $N_i$-byte data block with $M_i$-byte coding redundancy. All the compressed data blocks are placed contiguously into ($N_i$, $M_i$) ECC codewords, as shown in FIG. 6. This can ensure the use of minimal amount of ECC coding redundancy (i.e., always protect each $N_i$-byte user data with only $M_i$-byte coding redundancy). Evidently, some compressed data blocks will be divided and placed into two adjacent ($N_i$, $M_i$) ECC codewords, e.g., the compressed block B as shown in FIG. 6. This leads to a read amplification and hence storage speed performance degradation. For each LBA data block, the SSD FTL records the following information: (1) the length of its compressed block, and (2) the physical address of the first ($N_i$, $M_i$) ECC codeword which the compressed block is placed into. The operations of general-purpose partitions can be summarized as follows:

(1) All the LBA blocks are compressed using a general-purpose compression algorithm, which can well compress data with a variety of content/characteristics but consume high compression/decompression energy.

(2) By allowing one compressed block to be divided and placed into two adjacent constant-length ECC codewords, it minimizes the physical storage space usage but meanwhile is subject to larger read amplification and hence storage speed performance degradation.

Figure 7:
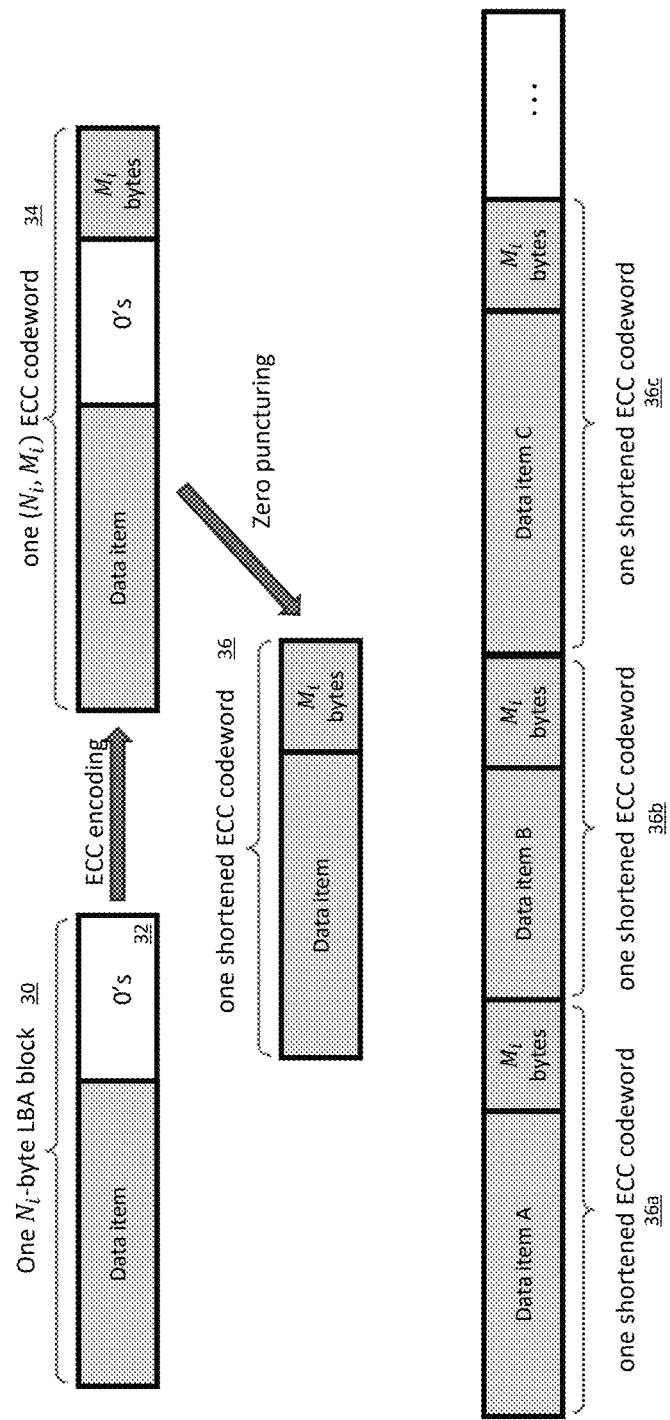
FIG. 7 illustrates the LBA data block compression and ECC encoding in zero-padded partitions, in accordance with an illustrative embodiment.

For zero-padded level-i partition with the LBA block size of $N_i=4096/2^i$ bytes, as shown in FIG. 7, each $N_i$-byte LBA data block 30 is assumed to contain an all-zero vector 32 at its tail. For each $N_i$-byte LBA data block 30, we first perform ECC encoding to generate an ($N_i$, $M_i$) ECC codeword 34, then we puncture off the tail all-zero vector of the $N_i$-byte LBA block, i.e., assume the tail all-zero vector is k-byte long, we remove the k-byte all-zero vector tail from the $N_i$-byte LBA block, hence the ($N_i$, $M_i$) ECC codeword is shortened to an ($N_i$−k, $M_i$) ECC codeword 36. Since different $N_i$-byte LBA data blocks may contain different amount of tail zeros, the shortened ECC codewords 36a, 36b, 36c will have different codeword length. All the variable-length shortened ECC codewords are compactly placed on the physical flash memory storage space, as shown at the bottom of FIG. 7. For each LBA block, the SSD FTL records the following information: (1) the length of the all-zero vector that has been punctured, and (2) the physical address of the shortened ECC codeword. The operations of zero-padded partitions can be summarized as follows:

(1) Storage space usage reduction is realized by simply puncturing tail zeros 32 in each LBA data block, which is much more energy efficient than using general-purpose compression algorithms; and (2) Each compressed LBA block is protected by one ECC codeword that can be fetched from NAND flash memory individually. This obviates any read amplification. Nevertheless, shortened ECC codewords consume more coding redundancy (i.e., its coding redundancy $M_i/(N_i-k)$ is larger than the coding redundancy $M_i/(N_i)$ of un-shortened ECC codewords) and hence consume more physical storage space.

Figure 8:
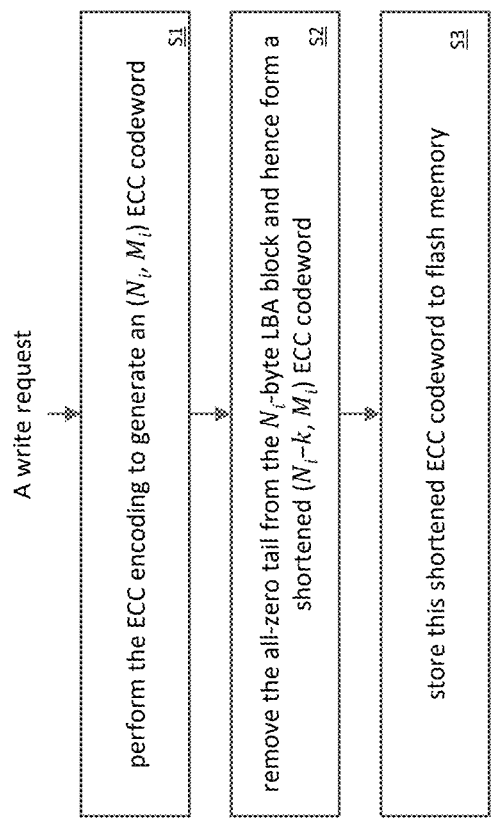
FIG. 8 illustrates the operational flow diagram of serving a write request in zero-padded partitions, in accordance with an illustrative embodiment.

FIG. 8 shows the operational flow diagram of serving a write request of a data item over zero-padded partitions. Upon receiving a request of writing an $N_i$-byte LBA data block into a zero-padded partition, at S1 the SSD first performs ECC encoding to generate an ($N_i$, $M_i$) ECC codeword. Then, at S2, remove the all-zero tail from the $N_i$-byte LBA block and hence form a shortened ($N_i$−k, $M_i$) ECC codeword. Finally, at S3, store this shortened ECC codeword to flash memory.

Figure 9:
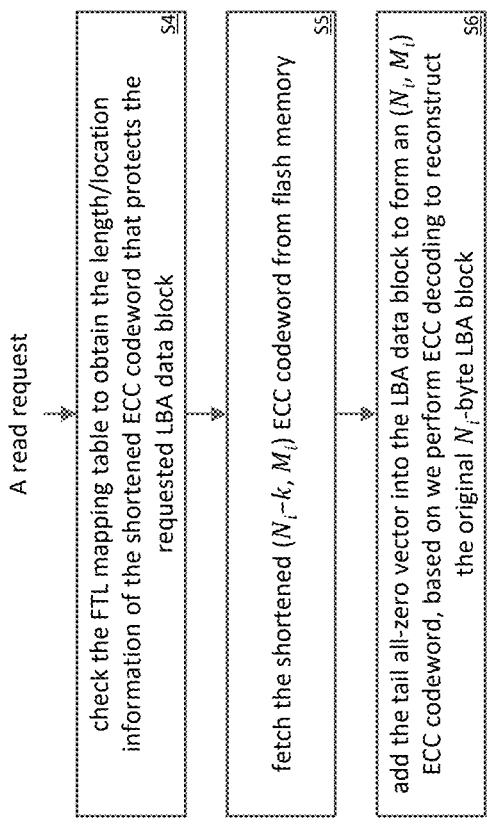
FIG. 9 illustrates the operational flow diagram of serving a read request in zero-padded partitions, in accordance with an illustrative embodiment.

FIG. 9 shows the operational flow diagram of serving a read request of a data block over zero-padded partitions. At S4, upon receiving a read request, the SSD first checks the FTL mapping table to obtain the length/location information of the shortened ECC codeword that protects the requested LBA data block. Then, at S5, fetch the shortened ($N_i$−k, $M_i$) ECC codeword from flash memory. At S6, add the tail all-zero vector into the LBA data block to form an ($N_i$, $M_i$) ECC codeword, based on we perform ECC decoding to reconstruct the original $N_i$-byte LBA block.

It is understood that aspects of the present disclosure may be implemented in any manner, e.g., as a software/firmware program, an integrated circuit board, a controller card, etc., that includes a processing core, I/O, memory and processing logic. Aspects may be implemented in hardware or software, or a combination thereof. For example, aspects of the processing logic may be implemented using field programmable gate arrays (FPGAs), application specific integrated circuit (ASIC) devices, and/or other hardware-oriented systems.

Aspects also may be implemented with a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random-access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, etc. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on a host computer, partly on a host computer, on a remote computing device (e.g., a memory card) or entirely on the remote computing device. In the latter scenario, the remote computing device may be connected to the host computer through any type of interface or network. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to control electronic circuitry in order to perform aspects of the present disclosure.

Computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. The computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by hardware and/or computer readable program instructions.

The flowcharts and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The foregoing description of various aspects of the present disclosure has been presented for purposes of illustration and description. It is not intended to be exhaustive or to limit the concepts disclosed herein to the precise form disclosed, and obviously, many modifications and variations are possible. Such modifications and variations that may be apparent to an individual in the art are included within the scope of the present disclosure as defined by the accompanying claims.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A multimode solid-state drive (SSD), comprising:
a plurality of flash memory chips (flash memory) addressable via physical block addresses (PBAs); and
a controller chip that utilizes a mapping table to map logical block addresses (LBAs) to PBAs, wherein the controller chip includes a general-purpose mode and a zero-padding mode for providing compression and error correction coding (ECC) and implements a process that includes:
in response to a determination that a data item is to be written into flash memory using the zero-padding mode:
padding the data item with an all-zero tail to form an LBA data block of a predefined size;
performing ECC coding on the LBA block to generate an ECC codeword;
removing the all-zero tail from the ECC codeword to generate a shortened ECC codeword; and
storing the shortened ECC codeword in flash memory.

2. The multimode SSD of claim 1, wherein the controller chip implements a further process that includes:
in response to a determination that a datablock is to be read from flash memory using the zero-padding mode:
checking the mapping table to obtain length and location information of the shortened ECC codeword that protects the LBA block containing the data item;
fetching the shortened ECC codeword from flash memory; and
adding the all-zero tail into the shortened ECC codeword and perform ECC decoding to generate the LBA block.

3. The multimode SSD of claim 1, wherein determining whether to use general-purpose mode or zero-padding mode is based on a size of the data item.

4. The multimode SSD of claim 1, wherein the SSD includes partitions for different block sizes, and wherein determining whether to use general-purpose mode or zero-padding mode is based on the partition being utilized to store the data item.

5. The multimode SSD of claim 1, wherein the controller chip implements a further process that includes:
in response to a determination that a specified LBA block is to be written into flash memory using the general-purpose mode:
compressing the specified LBA block to generate a compressed data block;
placing the compressed data block with other compressed data blocks to form a contiguous set of data blocks; and
performing ECC coding on the contiguous set of data blocks.

6. A method for providing compression and error correction coding (ECC) in a solid-state drive (SSD), comprising:
determining whether a data item is to be written to flash memory using a general-purpose mode or a zero-padding mode:
in response to a determination that a data item is to be written into flash memory using the zero-padding mode:
padding the data item with an all-zero tail to form an logical block address (LBA) data block of a predefined size;
performing ECC coding on the LBA block to generate an ECC codeword;
removing the all-zero tail from the ECC codeword to generate a shortened ECC codeword; and
storing the shortened ECC codeword in flash memory.

7. The method of claim 6, wherein in response to a determination that the data item is to be read from flash memory using the zero-padding mode:
checking the mapping table to obtain length and location information of the shortened ECC codeword that protects the LBA block containing the data item;
fetching the shortened ECC codeword from flash memory; and
adding the all-zero tail into the shortened ECC codeword and perform ECC decoding to generate the LBA block.

8. The method of claim 6, wherein determining whether to use the general-purpose mode or zero-padding mode is based on a size of the data item.

9. The method of claim 6, wherein the SSD includes partitions for different block sizes, and wherein determining whether to use general-purpose mode or zero-padding mode is based on the partition being utilized to store the data item.

10. The method of claim 6, wherein in response to a determination that a specified LBA block is to be written into flash memory using the general-purpose mode:
compressing the specified LBA block to generate a compressed data block;
placing the compressed data block with other compressed data blocks to form a contiguous set of data blocks; and
performing ECC coding on the contiguous set of data blocks.

11. A multimode solid-state drive (SSD), comprising:
a plurality of flash memory chips (flash memory) addressable via physical block addresses (PBAs); and
a controller chip that utilizes a mapping table to map logical block addresses (LBAs) to PBAs, wherein the controller chip implements a process that includes:
receiving a data item to be written to flash memory;
padding the data item with an all-zero tail to form an LBA data block of a predefined size;
performing error correction coding (ECC) on the LBA block to generate an ECC codeword;
removing the all-zero tail from the ECC codeword to generate a shortened ECC codeword; and
storing the shortened ECC codeword in flash memory.

12. The multimode SSD of claim 11, wherein the controller chip implements a further process that includes:
receiving a read request for an LBA block;
checking the mapping table to obtain length and location information of the shortened ECC codeword that protects the LBA block containing the data item;
fetching the shortened ECC codeword from flash memory; and
adding the all-zero tail into the shortened ECC codeword and perform ECC decoding to generate the LBA block.

* * * * *